(12) United States Patent
Su et al.

(10) Patent No.: US 6,246,075 B1
(45) Date of Patent: Jun. 12, 2001

(54) TEST STRUCTURES FOR MONITORING GATE OXIDE DEFECT DENSITIES AND THE PLASMA ANTENNA EFFECT

(75) Inventors: Hung-Der Su, Kaohsiung; Jian-Hsing Lee; Di-Son Kuo, both of Hsin-Chu, all of (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 0 days.

(21) Appl. No.: 09/507,883

(22) Filed: Feb. 22, 2000

Related U.S. Application Data

(63) Continuation of application No. 08/813,758, filed on Mar. 7, 1997, now Pat. No. 6,028,324.

(51) Int. Cl.[7] .......................... H01L 23/58; H01L 27/108
(52) U.S. Cl. .............................................. 257/48; 257/296
(58) Field of Search ....................... 257/48, 296; 438/11, 438/14, 15, 18

(56) References Cited

U.S. PATENT DOCUMENTS

| | | | |
|---|---|---|---|
| 5,350,710 | 9/1994 | Hong et al. | 437/170 |
| 5,393,701 | 2/1995 | Ko et al. | 437/193 |
| 5,434,108 | 7/1995 | Ko et al. | 437/228 |
| 6,028,324 | * 2/2000 | Su et al. | 257/48 |

OTHER PUBLICATIONS

Shin et al, "Thickness and Other Effects on Oxide and Interface Damage by Plasma Processing", published in the 1993 IEEE International Reliability Physics Proceedings, p. 272–279.

* cited by examiner

Primary Examiner—Steven Loke
(74) Attorney, Agent, or Firm—George O. Saile; Stephen B. Ackerman

(57) ABSTRACT

An ensemble of test structures comprising arrays of polysilicon plate MOS capacitors for the measurement of electrical quality of the MOSFET gate insulation is described. The test structures also measure plasma damage to these gate insulators incurred during metal etching and plasma ashing of photoresist. The structures are formed, either on test wafers or in designated areas of wafers containing integrated circuit chips. One of the test structures is designed primarily to minimize plasma damage so that oxide quality, and defect densities may be measured unhampered by interface traps created by plasma exposure. Other structures provide different antenna-to-oxide area ratios, useful for assessing plasma induced oxide damage and breakdown. The current-voltage characteristics of the MOS capacitors are measured by probing the structures on the wafer, thereby providing timely process monitoring capability.

3 Claims, 7 Drawing Sheets

TEST STRUCTURES FOR MONITORING GATE OXIDE DEFECT DENSITIES AND THE PLASMA ANTENNA EFFECT

This application is a Continuation of Ser. No. 08/813,758, filed on March 7, 1997, now issued as U.S. Pat. No. 6,028,324, and assigned to a common assignee.

BACKGROUND OF THE INVENTION (1) Field of the Invention

This invention relates to monitoring and diagnostics of line processes used for the manufacture of semiconductor devices and more particularly to the measurement of gate insulator defect densities and the plasma antenna effect.

(2) Description of Prior Art

In the manufacture of highly dense integrated circuits using Metal Oxide Semiconductor(MOS) technology with multiple metal layers, electrical charge may build up at the device gate oxide during plasma processing. The charge accumulates on large areas of metal or conductive polysilicon during pattern definition by plasma etching. The exposed metal areas act as antennas, accumulating charge from the plasma and thereby developing a high electrical potential across the gate oxide. Initial exposure occurs during the patterning of the polysilicon gate electrodes.

After the gate oxide layer is formed it is covered with a layer of polysilicon within which the gate electrode is defined. The etching of this polysilicon layer is accomplished by reactive ion etching (RIE), providing the first in a series of exposures of the edge of the polysilicon gate electrode to an rf plasma. In this instance the area of the gate electrode is covered with photoresist. As etching proceeds the large area of exposed polysilicon provides sufficient ballast to prevent local charge build-up. However, as the endpoint is approached, the polysilicon layer breaks up and the residual, now isolated, regions of polysilicon surrounding the photoresist protected gate electrode act as an antenna which accumulates charge. This results in the development of a potential sufficiently high to cause current flow through the gate oxide.

The polysilicon halos surrounding the photoresist covered gate can present a high antenna-to-gate oxide area ratio causing massive current flow in the oxide. As etching proceeds, the halos of polysilicon disappear and the antenna area is reduced to the thin edges of the gate electrode itself. After pattern formation is completed, the residual photoresist is removed by plasma ashing, again exposing the gate insulator to excessive current flow. This scenario is repeated during subsequent processing steps where metal layers, electrically connected to the polysilicon gate structures, are etched with rf plasmas.

The mechanism of current flow though the gate oxide is primarily Fowler-Nordheim(FN) tunneling. FN tunneling occurs at fields in excess of 10 MV/cm. Charge build up on the gate electrode resulting in a gate electrode potential of only 10 volts is therefore sufficient to induce FN tunneling through an oxide layer of 100 Angstroms. Such potentials are readily achieved in conventional plasma reactors. Excessive FN tunneling currents eventually lead to positively charged interface traps in the oxide which may lead to subsequent dielectric breakdown.

Large area capacitors, widely used for monitoring defects in the oxide layer, seriously over-estimate the density of shorts because of oxide stressing by plasma etching and ashing. This is pointed out by Shin et.al. in "Thickness and other Effects on Oxide and Interface Damage by Plasma Processing" (published in the 1993 IEEE International Reliability Physics Proceedings, pp 272–279). It is shown that plasma damage depends upon the area of aluminum conductor exposed to the plasma and not on the area of the gate oxide involved in the discharge path. Thus the use of large area aluminum pads, exposed to plasma processing, for evaluating oxide defect densities can grossly under-state the oxide quality.

Several method have been developed which reduce the exposure of conductive antennae to plasma radiation. In one such method, Ko, et.al. U.S. Pat. No. 5,434,108, the metal conductors are grounded by connections which are severed after the plasma exposure. In Ko, et.al. U.S. Pat. No. 5,393,701, the large area metal pads are deposited but not in connection with the sensitive MOS gates. After forming an insulative layer over the pads, a second metal deposition with reduced metal to plasma exposure, makes connection between the large area pads and the polysilicon gates through vias in the insulative layer.

Hong and Ko U.S. Pat. No. 5,350,710 describe an anti-fuse element which isolates large metal pads from sensitive MOS elements during plasma processing. Afterwards the anti-fuse element is made conductive by the application of voltage pulses.

Measuring and monitoring damage to gate oxides by plasma exposure requires the use of test structures which may be formed on special test wafers or designed into regions of the wafer saw kerf area where they are tested by probing prior to dicing. Such structures are disclosed by this invention.

SUMMARY OF THE INVENTION

It is an object of this invention to describe test structures which can be used to accurately measure gate oxide defect densities for shorts in a integrated circuit manufacturing process by minimizing interference by the plasma antenna effect.

It is another object to provide several test structures which can be used in concert to provide quantitative information on both gate oxide defect densities and plasma damage as incurred during metal patterning.

These objects are accomplished by an ensemble of test structures which utilize a plurality of small polysilicon gate electrodes over isolated island of gate oxide. These structures closely resemble polysilicon gate devices but are in fact, polysilicon MOS capacitors. A first structure, interconnecting an array of polysilicon gates with narrow stripes of metal is used to determine defect densities alone.

A second structure has a first metal plate lying over each polysilicon plate and connected to it by contacts through an interlevel insulating layer. A second metal, having the same narrow band pattern as the metal in the first structure, interconnects the first metal plates through vias in an inter-metal insulating layer.

A third structure has first metal plates each lying over a plurality of polysilicon plates, connecting to them through contacts in a first interlevel dielectric layer. The large area first metal plates provide a high metal-to-oxide area ratio during plasma processing causing an antenna effect. A second metal, having the same narrow stripe pattern as the metal in the first structure, interconnects the first metal plates through vias in an inter-metal insulating layer.

The test structures are subjected to the normal integrated circuit processing procedures which are used to form polysilicon gate MOSFETs and associated metal wiring levels. These procedures include steps wherein the polysilicon plates or their metal connections are subjected to plasmas during reactive-ion-etching(RIE) and plasma ashing of photoresist. The structures are fitted with probe contacts and with protective diodes to minimize plasma damage.

Current-Voltage (I-V) measurements are made on the structures at discrete times during the processing. During these measurements the protective diodes are reverse biased. The resultant I-V characteristics yield oxide defect densities related to leakage and reliability as well as information regarding additional damage produced in the oxide by each plasma exposure. The I-V measurements may also be complemented with capacitance-voltage(C-V) measurements.

The second and third structures are used to evaluate both defect densities and the plasma antenna effect.

DESCRIPTION OF THE PREFERRED EMBODIMENTS

Accordingly, in the embodiments of this invention, a p-type <100> oriented silicon wafer is provided. The formation of three test structure embodiments will be recited. The sequence of processing steps are consistent with well known MOSFET manufacturing methods. A basic structure which includes an array of the polysilicon plate MOS capacitors is common to all three embodiments and is first described.

Figure 1:
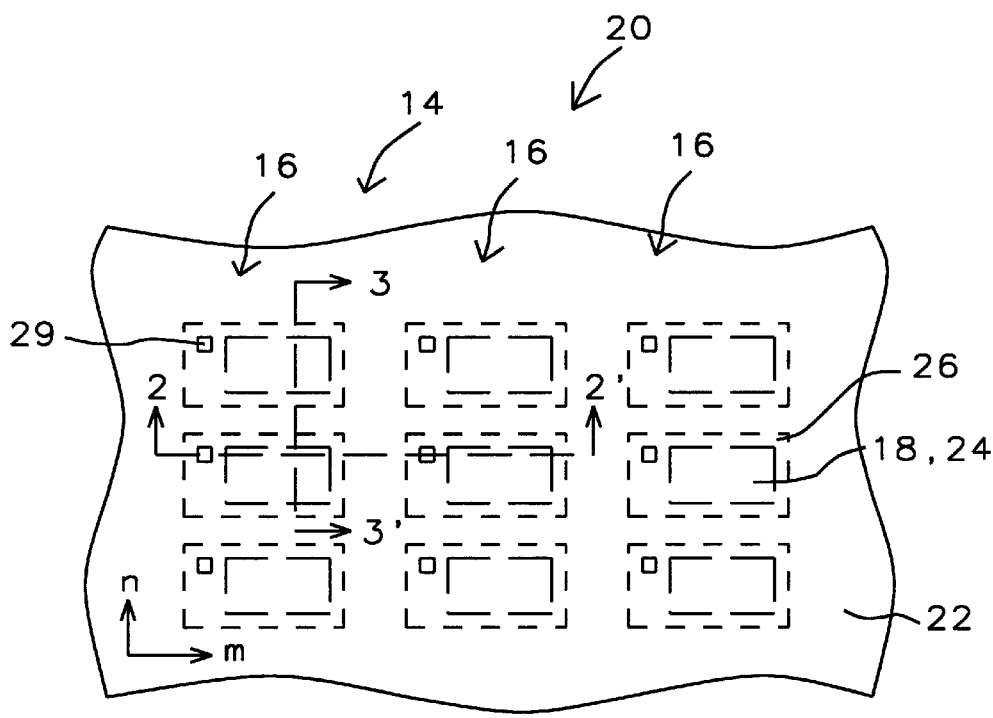
FIG. 1 is a top view of a basic array of polysilicon plate MOS capacitors used in the embodiments of this invention.

Referring to FIG. 1, there is shown a top view of an array 14 of polysilicon plate MOS capacitors 16 on a wafer 20 which comprises the basic structure upon which each of the three embodiments of this invention are built.

The array 14 consists of an n×m array of rectangular areas in which polysilicon plate MOS capacitors 16 are to be formed. The values of n and m typically range between 10 and 100. The n capacitors 16 in each column are considered as a block. The array 14 then consists of m columns of MOS capacitors 16, each column having n members. For the example illustrated in FIG. 1 and in the succeeding figures, a 3×3 array is used and includes 3 columns each having 3 members.

The test structures may be formed on test wafers or they may be formed in designated test chip sites on wafers containing integrated circuit (IC) dice. Since measurements are made before dicing, smaller test arrays may be located within the saw kerf of IC wafers.

Using the well known technique for the local oxidation of silicon(LOCOS), an array of rectangular islands of silicon active areas 18 are formed on the wafer 20, separated from each other by a field oxide 22. The field oxide 22 typifies that used for integrated circuit manufacture and is between 3,000 and 10,000 Ångstroms thick.

Figure 2:
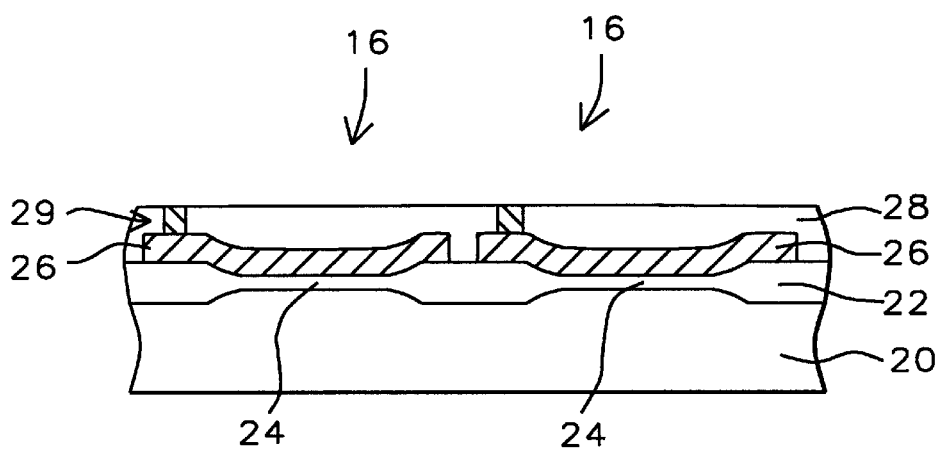
FIG. 2 is a cross sectional view of a portion of a basic array of polysilicon plate MOS capacitors used in the embodiments of this invention.
Figure 3:
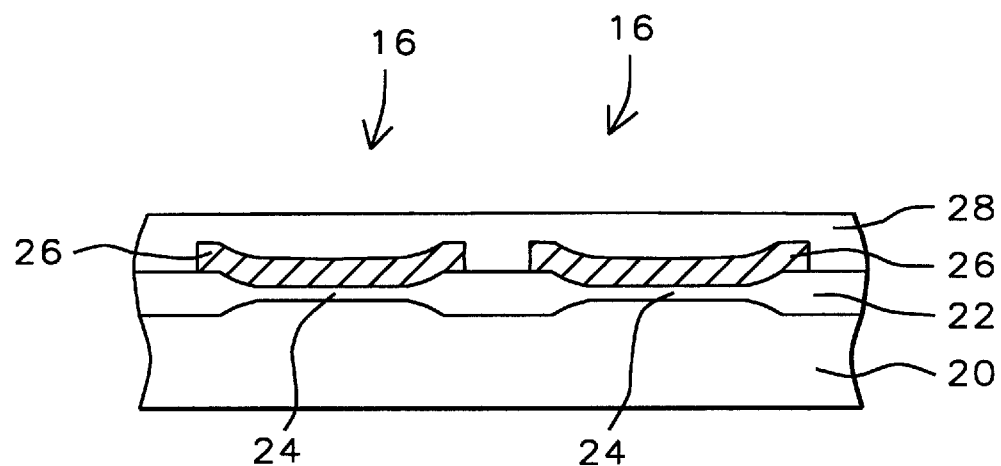
FIG. 3 is a cross sectional view of another portion of a basic array of polysilicon plate MOS capacitors used in the embodiments of this invention.

To better illustrate the processing steps used in the formation of the array 14, the reader is referred also to FIGS. 2 and 3 which are cross sections of the wafer 20 drawn along lines 2-2' and 3-3' of FIG. 1 respectively.

A gate insulator 24 is formed over the active areas 18. This is done with the same conditions, precautions and care afforded to the gate oxide formation of the IC product. The gate oxide is thermally grown and is between 50 and 300 Å thick.

Referring now to FIG. 2, the doped polysilicon gate electrode layer is patterned to form the capacitor plates 26 of the MOS capacitors 16 in the test structure. The areas of these plates are kept small to minimize charge accumulation during the polysilicon RIE and the subsequent plasma ashing of the photoresist mask which defines them. The areas of these capacitor plates are kept to less than about 100 and 1,000 square microns.

The next step in the formation of the test structures comprises the deposition of an interlevel dielectric layer (ILD) 28. The layer 28 is formed of either silicon oxide, a silicate glass such as phosphosilicate glass (PSG) or a borophosphosilicate glass (BPSG), or a composite layer of silicon oxide and a silicate glass. Contact openings are etched in the ILD layer 28 and contacts 29 to the polysilicon plates are formed, for example tungsten plug contacts.

This completes the recitation of the basic structure upon which the three embodiments of this invention are further constructed. The array 14 of polysilicon plate MOS capacitors 16 has been formed, and contacts 29 have been provided to connect the plates to subsequent metallization which differs in pattern among the three embodiments.

Figure 4:
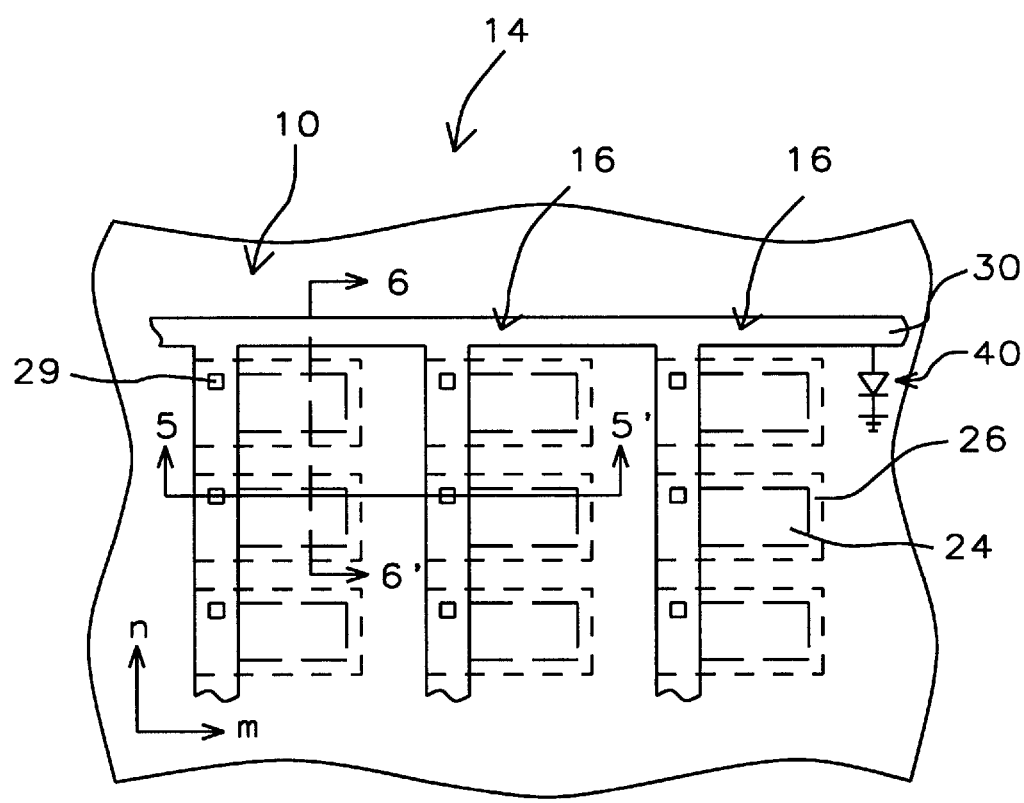
FIG. 4 is a top view of the first embodiment of this invention.
Figure 5:
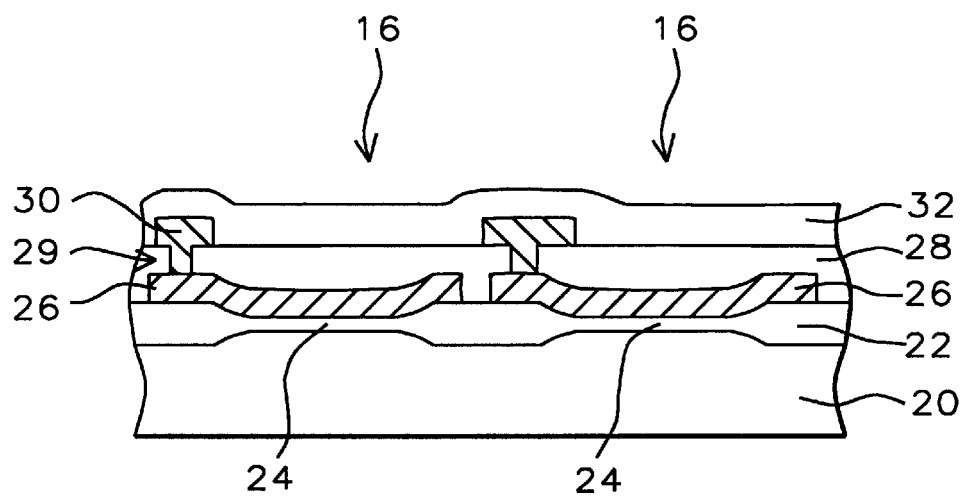
FIG. 5 is a cross sectional view of a portion of the first embodiment of this invention in one direction.
Figure 6:
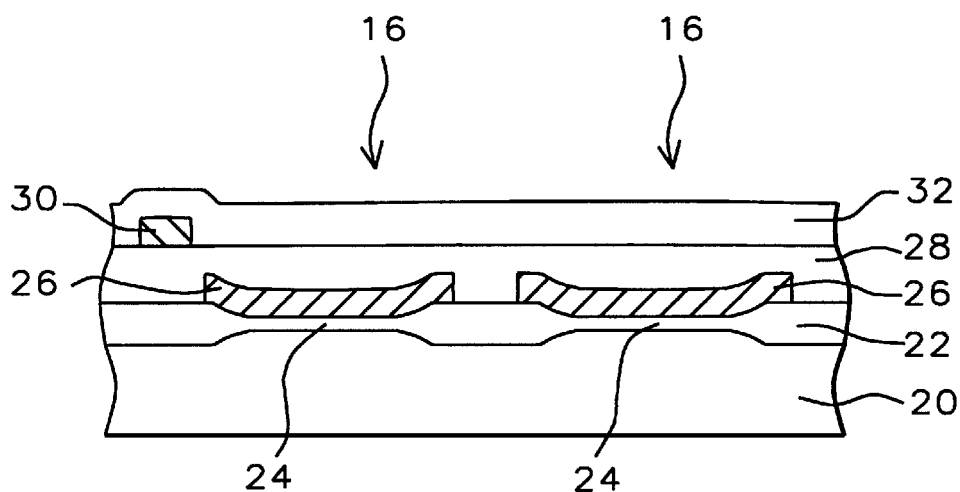
FIG. 6 is a cross sectional view of a portion of the first embodiment of this invention in another direction.

The reader is now referred to FIG. 4, which is a top view of the first embodiment of this invention. Also to be noted are FIGS. 5 and 6 which display the cross sections along the lines 5-5' and 6-6' of FIG. 4 respectively. In the first embodiment, a metal layer 30 is deposited over the basic structure described earlier. The metal 30 is patterned and etched by RIE and the photoresist is removed by plasma ashing, thereby exposing the underlying gate oxide to possible plasma damage. After patterning a passivation layer 32 is deposited over the structure and openings to probe pads are made to permit testing. The passivation layer is formed by first depositing about 2,000 Angstroms silicon oxide followed by about 7,000 Angstroms silicon nitride. The probe pad openings are made by RIE.

The metal pattern 30, shown in FIG. 4, consists of a narrow stripe configuration which interconnects the contacts of the MOS capacitors 16. A protective diode 40 is connected to the metal stripe 30 to shunt any excessive charge build up on the metal stripe 30 to ground. A probe pad (not shown) located elsewhere on the stripe 30, and away from the array, is provided to make I-V leakage measurements on the array of capacitors. Such measurements may be made at this point in the processing to evaluate the quality of the gate oxide layer. leakages revealed by the I-V characteristic yield information on shorts and interface charge densities which are related to oxide defects. By using a narrow metal stripe 30 for the interconnection wiring of the MOS capacitors 16 and the protective diode 40, the effects of plasma damage during metal definition are minimized. The antenna ratio is low and plasma current damage to even to the weakest capacitor in the array is low.

Figure 7:
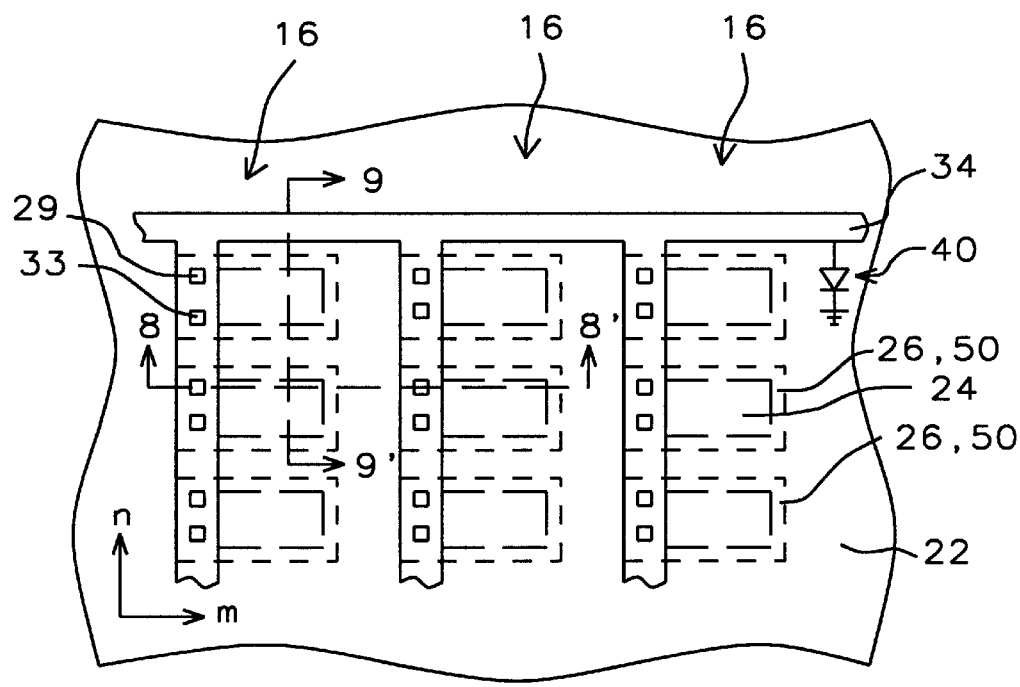
FIG. 7 is a top view of the second embodiment of this invention.
Figure 8:
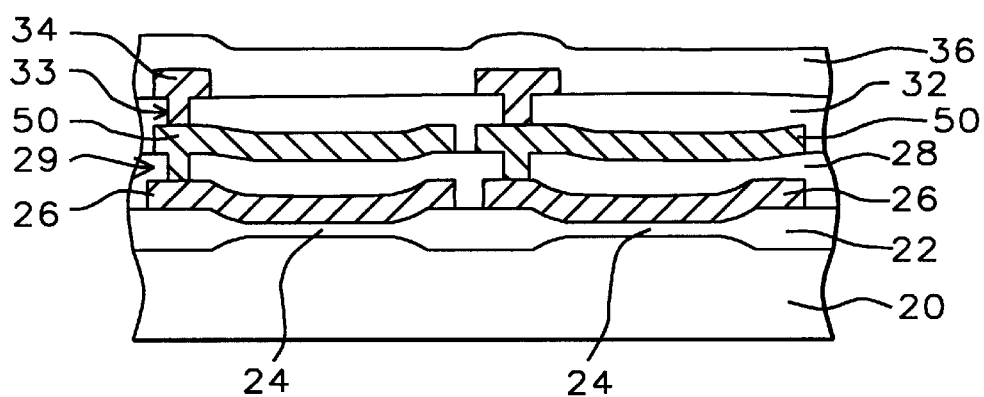
FIG. 8 is a cross sectional view of a portion of the second embodiment of this invention in one direction.
Figure 9:
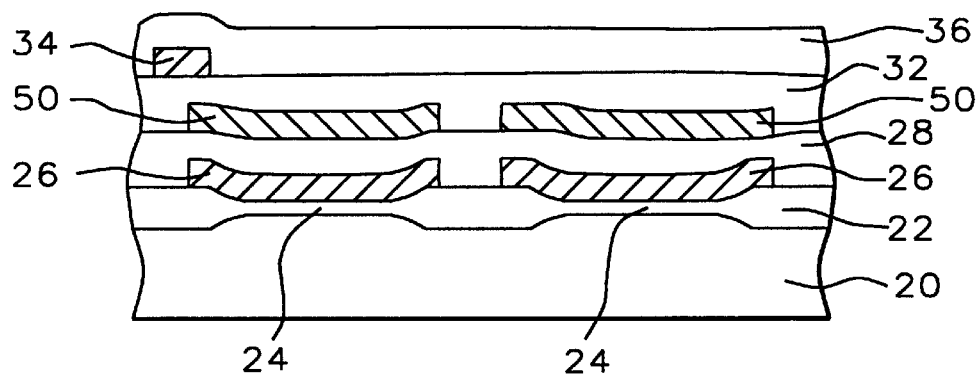
FIG. 9 is a cross sectional view of a portion of the second embodiment of this invention in another direction.

In a second embodiment a test structure is formed upon the basic structure (FIG. 1) by depositing a metal layer over it. The metal is patterned and etched by RIE and the photoresist is removed by plasma ashing, thereby exposing the underlying gate oxide to possible plasma damage. The resultant pattern is shown in FIG. 7, but can be better illustrated by the cross sections 8–8' and 9–9' in FIGS. 8 and 9 respectively.

The metal layer is etched to form rectangular plates 50 on the ILD layer 28 said plates having identical shapes as the polysilicon MOS capacitor plates 26 and lying concentrically above them. The metal plates 50 are connected to their respective subjacent polysilicon plates 26 by the contacts 29. At this point the MOS capacitors 16 are still isolated and have been subjected to the plasma exposures incurred during the metal RIE and the subsequent photoresist ashing. The antenna ratio, defined as the ratio of the conductor area exposed to the plasma to the area of the gate oxide, for these plasma processes is only slightly greater than 1:1.

A second insulative layer 32 is deposited. The layer 32 is an inter-metaldielectric(IMD) layer and may be formed in the same manner as the ILD layer 28. Via openings are etched in the IMD 32 and the vias 33 are formed either by using plug technology or by filling with the next layer of metallization. A second metal layer 34 is next deposited and patterned with photoresist. The second metal pattern 34 (see FIG. 7) which interconnects the MOS capacitor plates 26 is identical to the first metal pattern 30 (FIG. 4) used for the first embodiment and therefore has the same antenna ratio. The pattern terminates in a probe pad(not shown) and is provided with a protective diode shunt 40 located outside of the array.

A passivation layer formed by first depositing about 2,000 Angstroms silicon oxide followed by about 7,000 Angstroms silicon nitride. The probe pad openings are made by RIE. I-V measurements are made on the completed test structures. These are then evaluated both for gate oxide defect densities and plasma damage.

A third embodiment of this invention is formed in a similar manner as the second embodiment. The pattern of the first metal layer is different, however. In the third embodiment, a single first metal pad extends over an entire block of polysilicon MOS capacitors, thereby increasing the susceptibility of the MOS oxides to plasma damage by having a larger antenna area.

Figure 10:
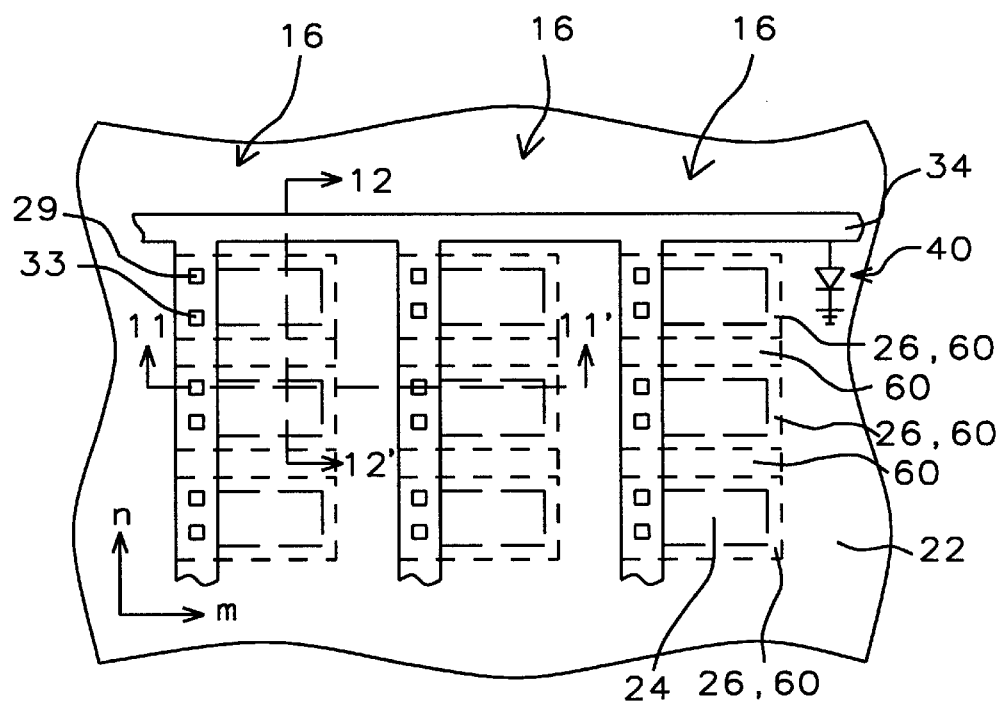
FIG. 10 is a top view of the third embodiment of this invention.

A top view of the third embodiment is shown in FIG. 10. The first metal layer is patterned to form metal plates 60 each of which extends over a plurality of the polysilicon capacitor plates 24 in each column. The group of MOS capacitors 16 thus covered by the first metal plate may be referred to as a block. Each column of capacitors in the array may comprise a single block or may be broken up to contain several blocks.

Figure 11:
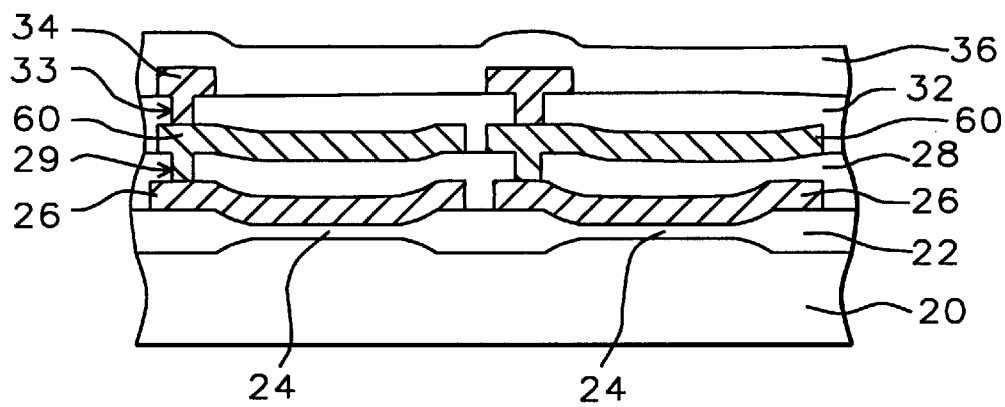
FIG. 11 is a cross sectional view of a portion of the third embodiment of this invention in one direction.
Figure 12:
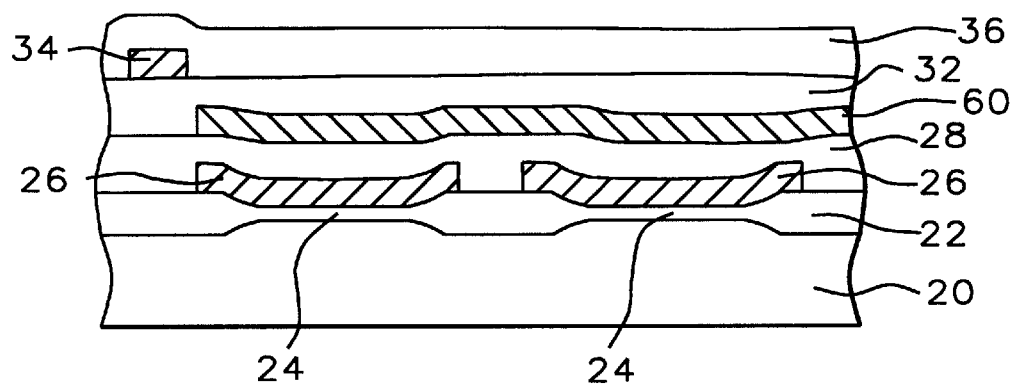
FIG. 12 is a cross sectional view of a portion of the third embodiment of this invention in another direction.

The view of the cross section indicated by the line 12–12' in FIG. 10 is shown in FIG. 12. The first metal plate 60 is continuous over the polysilicon plates 26. The second metal 34 which joins all the plates in the array is identical to the pattern 34 of the second embodiment (FIG. 7) and pattern 30 of the first embodiment (FIG. 4), being formed of a narrow stripe, having a protective diode 40 and a probe pad(not shown) located outside the array. The cross section of the FIG. 10 line 11–11' shown in FIG. 11 illustrates the interconnections 29 and 33 of the conductive components of the structure.

Figure 13:
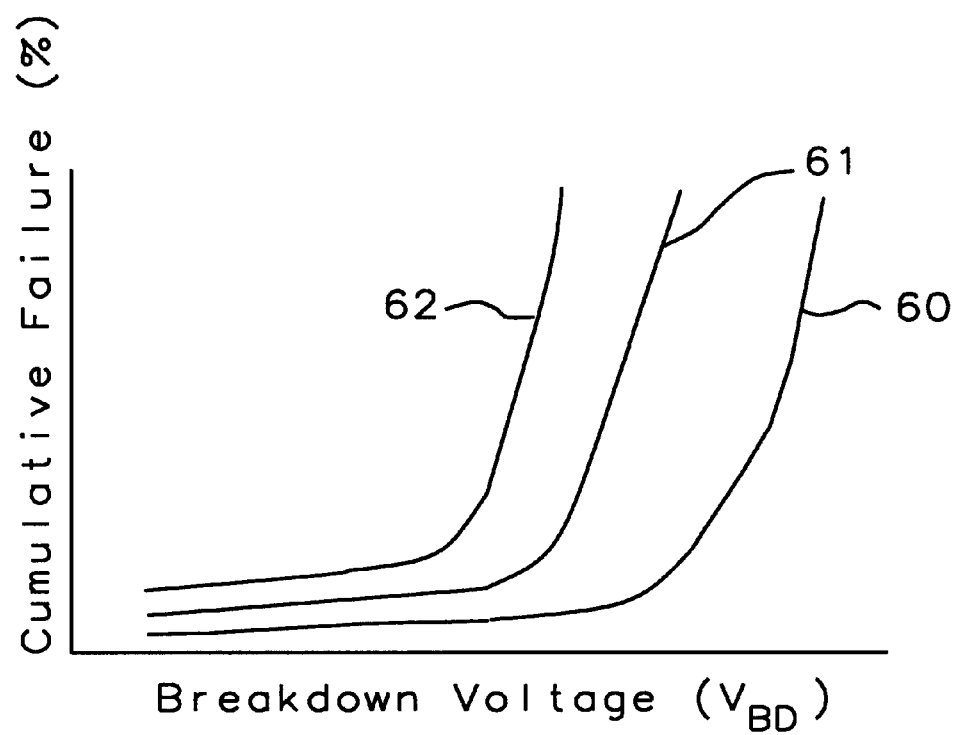
FIG. 13 is a plot of percent failure vs. breakdown voltage for three embodiments of this invention.

The three embodiments just described when used in concert can provide valuable and concise summary of the accumulation of plasma damage to gate oxides during processing. In FIG. 13 there is shown a family of curves depicting the distribution of breakdown voltages for the three embodiments of this invention just described. The curves 60 represents the breakdown voltage ($V_{BD}$) as measured on structures of the first embodiment. Curves 61 and 62 represent the second and third embodiments respectively. As the wafers are subjected to additional exposures to plasmas the breakdown voltage distribution shift towards lower values of $V_{BD}$. The embodiment exposed to the greater number of plasma processing steps suffers the greatest degradation of $V_{BD}$. Since the embodiments are all built on the same basic gate structure the relative contribution of the additional plasma processing steps undergone by one embodiment over another is easily evaluated.

Families of parametric curves such as defect density, interface state density, threshold voltage, and others may be similarly constructed to reflect the plasma effects on the sequentially formed embodiments. The measurement and interpretation of these parameters is understood by those skilled in the art and they may be used to signal process abnormalities and pinpoint their cause. Remedial steps may then be taken in a timely and cost effective manner to bring the process under control.

Additional embodiments representing higher levels of metallization if such levels exist in the process are readily formed by extension of the concepts of the embodiments described. In order to properly compare results between structures representing different process stages, it is important to keep the configuration and size of the silicon active areas the same in each set of test structures.

While this invention has been particularly shown and described with reference to the preferred embodiments thereof, it will be understood by those skilled in the art that various changes in form and details may be made without departing from the spirit and scope of the invention.

While the embodiments of this invention utilize a p-type silicon substrate, an n-type silicon substrate could also be used without departing from the concepts therein provided. It should be further understood that the substrate conductivity type as referred to herein does not necessarily refer to the conductivity of the starting wafer but could also be the conductivity of a diffused region within a wafer wherein the semiconductor devices are incorporated.

What is claimed is:

1. A method for measuring a test structure for evaluating the effects of plasma processing on gate oxide quality of an integrated circuit comprising:
   (a) forming a test structure on a silicon wafer comprising:
      (i) an array of MOS capacitors comprising:
         (a) a gate oxide formed over each of an array of islands of active silicon area surrounded by a field oxide, wherein each of said islands defines a lower plate of one of said array of MOS capacitors; and (b) polysilicon plates formed over said gate oxides, each of said polysilicon plates covering a corresponding gate oxide of one of said array of islands and extending over said field oxide, thereby forming an upper plate of one of said MOS capacitors;

(ii) a dielectric layer formed over said array of MOS capacitors;

(iii) a plurality of conductive contacts formed in openings in said dielectric layer, each of said plurality of conductive contacts being connected to one of said polysilicon plates; and (iv) metal wiring patterned over said dielectric layer connecting said polysilicon plates to a probe pad through respective said conductive contacts; and (v) a protective diode connected between said metal wiring and said silicon wafer;

(b) connecting probes to said probe pad and said silicon wafer;

(c) providing a reverse bias across said protective diode; and (d) performing current-voltage (I-V) measurements on said structure.

2. A method for measuring a test structure for evaluating the effects of plasma processing on gate oxide quality of an integrated circuit comprising:

(a) forming a test structure on a silicon wafer comprising
  (i) an array of MOS capacitors comprising:
    (a) a gate oxide formed over each of an array of islands of active silicon area surrounded by a field oxide, wherein each of said islands defines a lower plate of one of said array of MOS capacitors; and
    (b) polysilicon plates formed over said gate oxides, each of said polysilicon plates covering a corresponding gate oxide of one of said array of islands and extending over said field oxide, thereby forming an upper plate of one of said MOS capacitors;
  (ii) a first dielectric layer formed over said array of MOS capacitors;
  (iii) a plurality of conductive contacts formed in openings in said first dielectric layer, with each of said plurality of conductive contacts connected to one of said polysilicon plates;
  (iv) a metal layer patterned over said first dielectric layer to form an array of metal plates, said metal plates having the same dimensions as said polysilicon plates lying in an array which coincides with said polysilicon plates, with each of said array of metal plates connected to a subjacent polysilicon plate through said respective conductive contacts;
  (v) a second dielectric layer formed over said metal layer;
  (vi) metal wiring patterned over said second dielectric layer, interconnecting said metal plates through respective vias in said second dielectric layer and connected to a probe pad; and
  (vi) a protective diode connected between said metal wiring and said silicon wafer;

(b) connecting probes to said probe pad and said silicon wafer;

(c) providing a reverse bias across said protective diode; and (d) performing current-voltage (I-V) measurements on said structure.

3. A method for measuring a test structure for evaluating the effects of plasma processing on gate oxide quality of an integrated circuit comprising:

(a) forming a test structure on a silicon wafer comprising
  (ii) an array of MOS capacitors comprising:
    (a) a gate oxide formed over each of an array of islands of active silicon area surrounded by a field oxide, wherein each of said islands defines a lower plate of one of said array of MOS capacitors, and
    (b) polysilicon plates formed over said gate oxides, each of said polysilicon plates covering a corresponding gate oxide of one of said array of islands and extending over said field oxide, thereby forming an upper plate of one of said MOS capacitors;
  (ii) a first dielectric layer formed over said array of MOS capacitors;
  (iii) a plurality of conductive contacts formed in openings in said first dielectric layer, with each of said plurality of conductive contacts connected to one of said polysilicon plates;
  (iv) a metal layer patterned over said first dielectric layer to form an array of metal plates, each of said array of metal plates extending over and connecting to a subjacent sub-group of said array of polysilicon plates through vias in said first dielectric layer;
  (v) a second dielectric layer formed over said array of metal plates;
  (vi) metal wiring patterned over said second dielectric layer, interconnecting said metal plates through respective vias in said second dielectric layer and connected to a probe pad; and
  (vii) a protective diode connected between said metal wiring and said silicon wafer;

(b) connecting probes to said probe pad and said silicon wafer;

(c) providing a reverse bias across said protective diode; and (d) performing current-voltage (I-V) measurements on said structure.

\* \* \* \* \*